United States Patent
Tapily

(10) Patent No.: US 10,453,737 B2
(45) Date of Patent: Oct. 22, 2019

(54) METHOD OF FILLING RETROGRADE RECESSED FEATURES WITH NO VOIDS

(71) Applicant: Tokyo Electron Limited, Minato-ku, Tokyo (JP)

(72) Inventor: Kandabara N. Tapily, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/950,611

(22) Filed: Apr. 11, 2018

(65) Prior Publication Data

US 2018/0294181 A1 Oct. 11, 2018

Related U.S. Application Data

(60) Provisional application No. 62/484,343, filed on Apr. 11, 2017.

(51) Int. Cl.
*H01L 21/762* (2006.01)
*H01L 21/02* (2006.01)

(52) U.S. Cl.
CPC .. *H01L 21/76224* (2013.01); *H01L 21/02164* (2013.01); *H01L 21/02178* (2013.01); *H01L 21/02186* (2013.01); *H01L 21/02216* (2013.01); *H01L 21/02277* (2013.01); *H01L 21/02639* (2013.01)

(58) Field of Classification Search
CPC ......... H01L 21/76224; H01L 21/02639; H01L 21/02178; H01L 21/02164; H01L 21/02186
See application file for complete search history.

(56) References Cited

U.S. PATENT DOCUMENTS 5,620,925 A * 4/1997 Nakata ............. H01L 21/28525
257/E21.586
6,969,539 B2 11/2005 Gordon et al.
(Continued)

OTHER PUBLICATIONS

D. Hausmann et al. "Rapid Vapor Deposition of Highly Conformal Silicate Nanolaminates," Science, vol. 298, Oct. 11, 2002, 402-406.
(Continued)

*Primary Examiner* — Anthony Ho

(57) ABSTRACT

A method is described for void-free material filling of fine recessed features found in semiconductor devices. According to one embodiment, the method includes providing a patterned substrate containing a recessed feature having an opening, a sidewall and a bottom, the sidewall including an area of retrograde profile relative to a direction extending from a top of the recessed feature to the bottom of the recessed feature, coating the substrate with a metal-containing catalyst layer, deactivating a portion of the metal-containing catalyst layer that is near the opening of the recessed feature by exposure to a halogen-containing gas, and selectively depositing a material on the metal-containing catalyst layer in the recessed feature that has not been deactivated by the halogen-containing gas. The method can further include repeating the coating, deactivating and selectively depositing at least once to deposit an additional amount of the material to fully fill the recessed feature.

20 Claims, 5 Drawing Sheets

(56) References Cited

U.S. PATENT DOCUMENTS 7,625,820 B1 12/2009 Papasouliotis et al.
8,008,743 B2 8/2011 Gordon et al.

OTHER PUBLICATIONS

H. Komiyama et al. "Chemical Reaction Engineering in the Design of CVD Reactors," Chemical Engineering Science 54 (1999) 1941-1957.
D. Josell et al. "Interconnect Fabrication by Superconformal Iodine-Catalyzed Chemical Vapor Deposition of Copper," Journal of The Electrochemical Society 150(5), (2003) C368-C373.
Z. Wang et al. "Bottom-Up Fill for Submicrometer Copper Via Holes of ULSIs by Electroless Plating," Journal of The Electrochemical Society 151(12), (2004) C781-C785.

\* cited by examiner

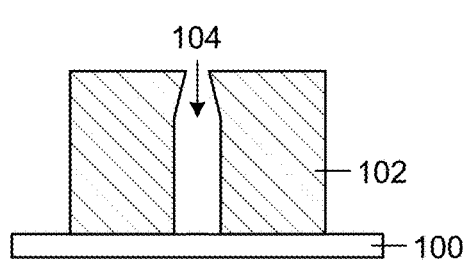
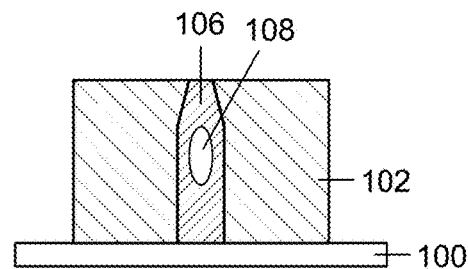
FIG. 1A
*Prior Art*
FIG. 1B
*Prior Art*
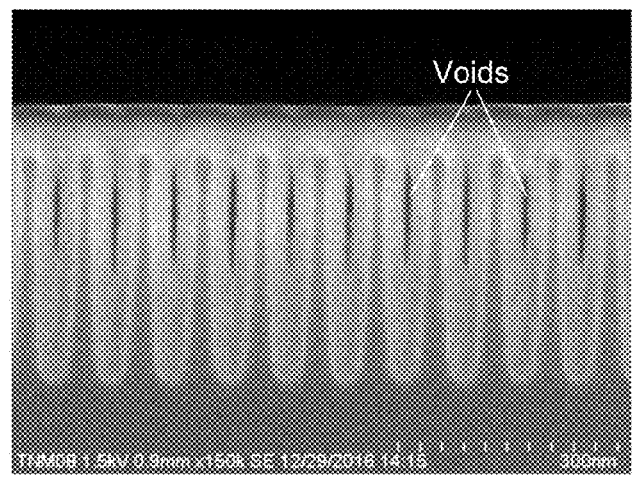
FIG. 2
*Prior Art*

METHOD OF FILLING RETROGRADE RECESSED FEATURES WITH NO VOIDS

CROSS-REFERENCE TO RELATED APPLICATIONS

This application is related to and claims priority to U.S. Provisional Patent Application Ser. No. 62/484,343, filed on Apr. 11, 2017, the entire contents of which are herein incorporated by reference.

FIELD OF THE INVENTION

This invention relates to methods for processing a substrate, and more particularly, to a method for void-free material filling of fine recessed features found in semiconductor devices.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after introduction of extreme ultra-violet (EUV) lithography. Patterning options that enable reduced variability, extend scaling and enhanced CD and process control are needed. Selective deposition of thin films such as void-free filling of fine recessed features is a key step in patterning in highly scaled technology nodes. However it's extremely challenging to fill trenches with retrograde profiles (bottle neck) with a material such that the trenches have no voids.

Silicon dioxide ($SiO_2$) is the most common dielectric material in silicon microelectronic devices. However, despite its importance, void-free and seam-free filling of fine recessed features with $SiO_2$ material has proved difficult to achieve at low temperatures. FIGS. 1A and 1B schematically show through cross-sectional views the problem of voids formed in a material when filling a recessed feature having a retrograde profile. FIG. 1A shows a recessed feature 104 with a retrograde profile formed in a film 102 on a base layer 100. The recessed feature 104 is extremely difficult to fill with a material such as $SiO_2$ without forming any voids in the $SiO_2$. FIG. 1B shows a void 108 that is formed in the $SiO_2$ material when the opening of the recessed feature 104 is pinched off by the $SiO_2$ that is being deposited. FIG. 2 shows a Scanning Electron Microscope (SEM) image of voids formed in $SiO_2$ filling recessed features with retrograde profiles.

Void-free filling of fine recessed features is critical for many applications in semiconductor manufacturing. Many gap-fill applications depend on void-free $SiO_2$ filling of fine recessed features, where the $SiO_2$ needs to be of high quality and void-free, in order to provide the same etch rate throughout the entire thickness of the $SiO_2$ fill.

SUMMARY OF THE INVENTION

A method is described for void-free material filling of fine recessed features found in semiconductor devices. According to one embodiment, the method includes providing a patterned substrate containing a recessed feature having an opening, a sidewall and a bottom, the sidewall including an area of retrograde profile relative to a direction extending from a top of the recessed feature to the bottom of the recessed feature, coating the substrate with a metal-containing catalyst layer, deactivating a portion of the metal-containing catalyst layer that is near the opening of the recessed feature by exposure to a halogen-containing gas, and selectively depositing a material on the metal-containing catalyst layer in the recessed feature that has not been deactivated by the halogen-containing gas. The method can further include repeating the coating, deactivating and selectively depositing at least once to deposit an additional amount of the material with no void in the recessed feature.

According to an embodiment of the invention, the method includes providing a patterned substrate containing a recessed feature having an opening, a sidewall and a bottom, the sidewall including an area of retrograde profile relative to a direction extending from a top of the recessed feature to the bottom of the recessed feature, coating the substrate with an $AlMe_3$ catalyst layer, deactivating a portion of the $AlMe_3$ catalyst layer that is near the opening of the recessed feature by exposure to a halogen-containing gas, selectively depositing an amount of a $SiO_2$ material on the $AlMe_3$ catalyst layer in the recessed feature that has not been deactivated by the halogen-containing gas, and repeating the coating, deactivating and selectively depositing at least once to deposit an additional amount of the $SiO_2$ material until the $SiO_2$ material fully fills the recessed feature.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIGS. 1A and 1B schematically show through cross-sectional views the problem of voids formed in a material when filling a recessed feature having a retrograde profile.

FIG. 2 shows a SEM image of voids formed in $SiO_2$ filling of recessed features having retrograde profiles;

DETAILED DESCRIPTION OF SEVERAL EMBODIMENTS

Figure 3A:
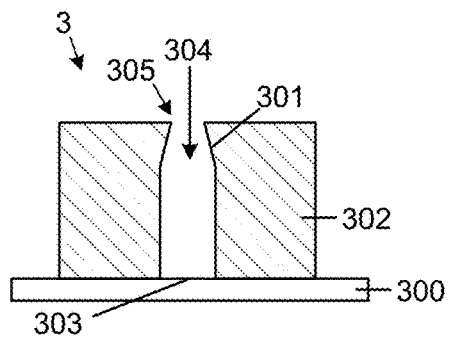
FIG. 3A-3G schematically shows through cross-sectional views a method of void-free filling of a recessed feature with a retrograde profile according to an embodiment of the invention.
Figure 3B:
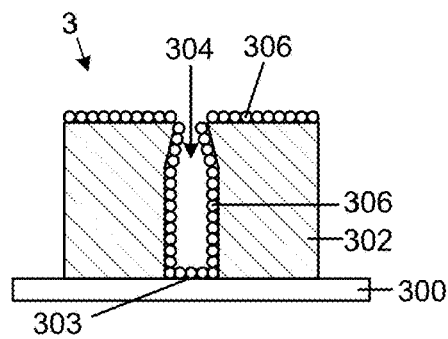
Figure 3C:
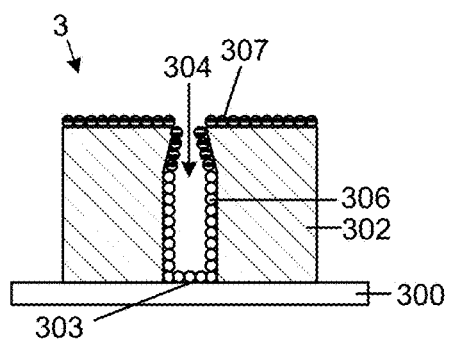
Figure 3D:
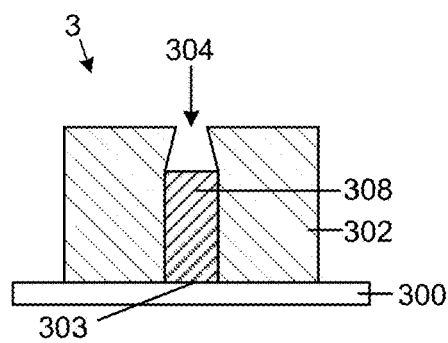
Figure 3E:
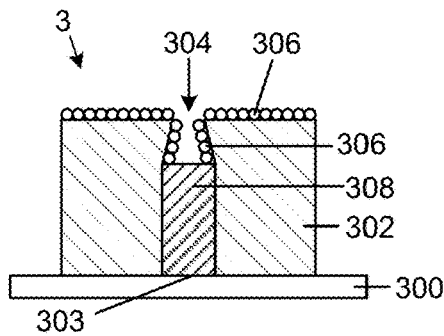
Figure 3F:
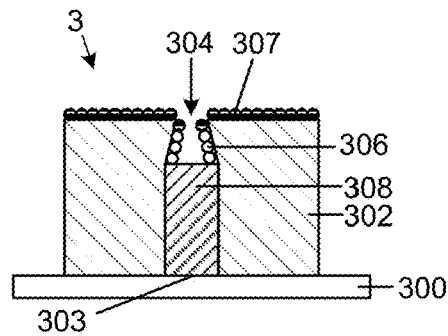
Figure 3G:
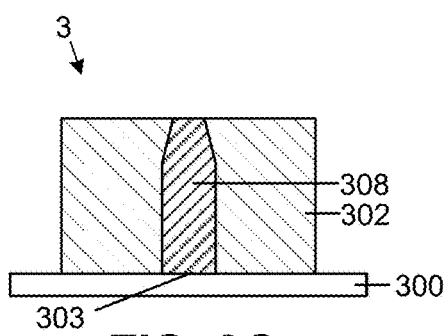
Figure 4:
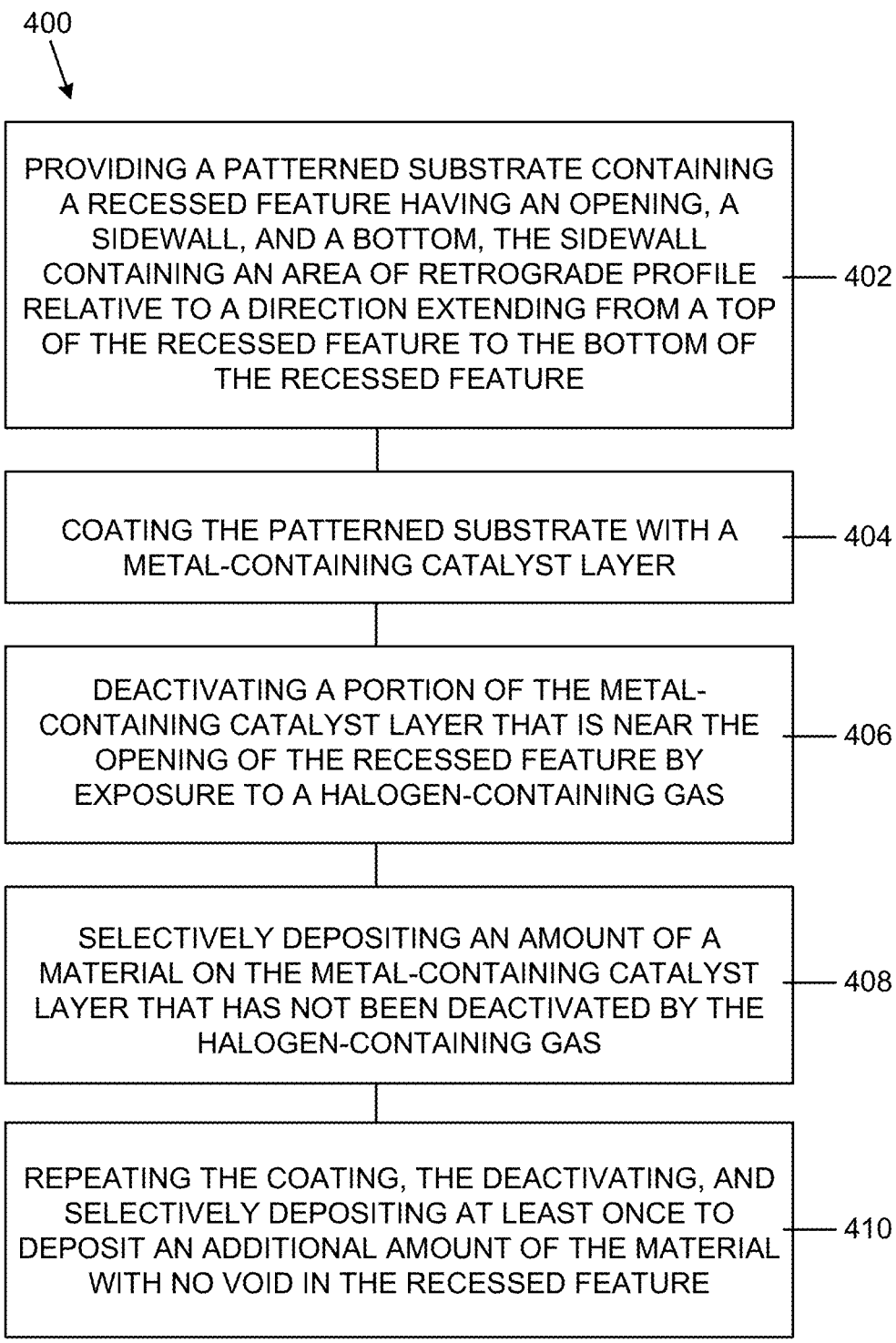
FIG. 4 is a process flow diagram for processing a substrate according to an embodiment of the invention.

FIG. 3A-3G schematically shows through cross-sectional views a method of void-free filling of a recessed feature with a retrograde profile according to an embodiment of the invention, and FIG. 4 is a process flow diagram for processing a substrate according to an embodiment of the invention. In FIG. 4, the process flow 400 includes, in 402, providing a patterned substrate containing a recessed feature having an opening, a sidewall and a bottom, the sidewall including an area of retrograde profile relative to a direction extending from a top of the recessed feature to the bottom of the recessed feature. FIG. 3A shows a substrate 3 with a recessed feature 304 having a retrograde profile formed in a film 302 on a base layer 300. The recessed feature 304 has an opening 305, a sidewall 301 and a bottom 303. The recessed feature can, for example, have a width near the bottom 303 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The recessed feature 304 can, for example, have a depth of 25 nm, 50 nm, 100 nm, 200 nm, or greater than 200 nm. In one example, the recessed feature can have a width near the bottom 303 between about 10 nm and about 50 nm, and a depth between about 100 nm and about 300 nm. In some examples, the film 302 and the base layer 300 can include Si, SiGe, SiN, SiON, SiCN, $SiO_2$, a III-V semiconductor, or a metal (e.g., Ru, Co, W, or Ni).

The method further includes, in 404, coating the patterned substrate 3 with a metal-containing catalyst layer 306. This is schematically shown in FIG. 3B. The metal-containing catalyst layer 306 may be formed by exposing the substrate 3 to a saturation amount of a gas containing a metal-containing precursor gas. The role of the metal-containing catalyst layer is to enable subsequent material deposition by gas exposure that reacts with the metal-containing catalyst layer 306. According to one embodiment, the metal-containing catalyst layer can contain aluminum (Al), titanium (Ti), or a combination thereof. According to one embodiment, the metal-containing catalyst layer may contain an Al-containing precursor and a Ti-containing precursor. Embodiments of the invention may utilize a wide variety of Al-containing precursors. For example, many aluminum precursors have the formula:

$$AlL^1L^2L^3D_x$$

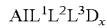

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(^tBu)_3$, $Al(^tBu)_2H$, $AlEt_2Cl$, $Et_3Al_2(O^sBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti(\eta^5-C_5(CH_3)_5)_2Cl$, $Ti(\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5(CH_3)_5)_2(H)_2$, and $Ti(CH_3)_2(\eta^5-C_5(CH_3)_5)_2$. $TiCl_4$ is an example of a titanium halide precursor containing a "Ti-halogen" bond.

The method further includes, in 406, deactivating a portion of the metal-containing catalyst layer 306 that is near the opening 305 of the recessed feature 304 by exposure to a halogen-containing gas. The deactivated portion 307 of the metal-containing catalyst layer 306 is schematically shown in FIG. 3C. Many halogen-containing gases readily react with or replace the metal-containing catalyst layer 306 upon contact, thereby forming halogen-containing surfaces near the opening 305 of the recessed feature 304 that cannot act to catalyze subsequent material deposition. An effective exposure of the halogen-containing gas that only affects the substrate near the opening of the recessed feature and does not significantly reach the bottom of the recessed feature gas by gas diffusion before being evacuated from the process chamber may be determined by routine experimentation, for example varying gas flow rate and concentration of the halogen-containing gas, and gas exposure time.

The halogen-containing gas may, for example, be selected from various chlorine-containing and bromine-containing gases. In some examples the halogen-containing gas may contain $Cl_2$, $BCl_3$, $CCl_4$, $TiCl_4$, HCl, HBr, or a combination thereof.

The method further includes, in 408, selectively depositing a material 308 on the metal-containing catalyst layer 306 that has not been deactivated by the halogen-containing gas. This is schematically shown in FIG. 3D. The deactivated portion 307 of the metal-containing catalyst layer 306 is not shown in FIG. 3D as it may be removed (e.g., by heat-treating) during or after the deposition of the material 308.

According to one embodiment, the material 304 that is deposited in the recessed feature can contain $SiO_2$ material. The $SiO_2$ material can be deposited by, in the absence of any oxidizing and hydrolyzing agent, and in the absence of a plasma, by exposing the substrate 3 at a substrate temperature of approximately 150° C. or less, to a process gas containing a silanol gas. In one example, the silanol gas may be selected from the group consisting of tris(tert-pentoxy) silanol (TPSOL), tris(tert-butoxy) silanol, and bis(tert-butoxy)(isopropoxy) silanol. The exposure deposits about 5-6 nm of $SiO_2$ material on the metal-containing catalyst layer and then the deposition automatically stops due to the blocking of the metal-containing catalyst layer 306 by the $SiO_2$ material.

In some examples, the process gas may further contain an inert gas such as Argon. In one embodiment, the process gas may consist of a silanol gas and an inert gas. Furthermore, according to one embodiment, the substrate temperature may be approximately 120° C., or less, during the exposing. In another embodiment, the substrate temperature may be approximately 100° C., or less.

The steps of coating, deactivating and selectively depositing are referred to as a deposition cycle. According to one embodiment, in 408, the deposition cycle may be repeated at least once to deposit an additional amount of the material 308 with no void in the recessed feature 304. This is schematically shown in FIGS. 3E-3G, where the recessed feature 304 has been fully filled with the material 308. The composition of the material 308 can contain a few atomic percent of the metal-containing catalyst.

Figure 5:
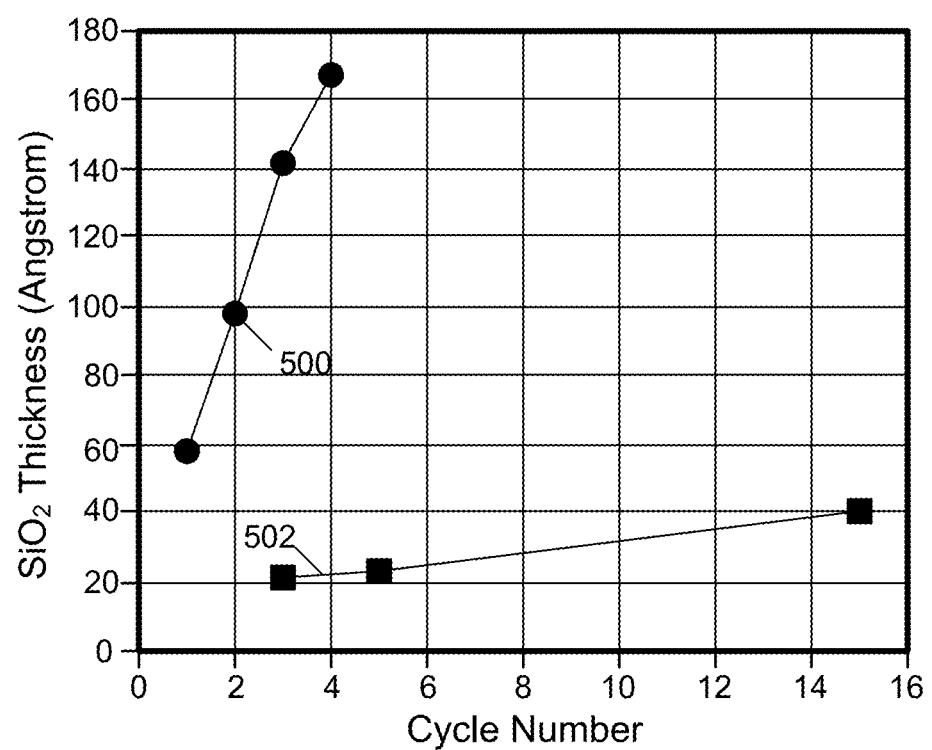
FIG. 5 shows $SiO_2$ thickness as a function of number of deposition cycles according to an embodiment of the invention.

FIG. 5 shows $SiO_2$ thickness as a function of number of deposition cycles according to an embodiment of the invention. The figure shows the effect of a $TiCl_4$ gas exposure of an $AlMe_3$-coated blanket substrate on subsequent $SiO_2$ deposition using a silanol gas. Trace 500 shows the result for deposition cycles that did not include deactivation steps but included sequential exposures of $AlMe_3$ and silanol (TPSOL) at 150° C. Each deposition cycle deposited about 4-6 nm of $SiO_2$ material on the $AlMe_3$ catalyst layer. Trace 520 shows the results for deposition cycles that included deactivation steps using sequential exposures of $AlMe_3$, $TiCl_4$, and silanol (TPSOL) at 150° C. The deactivation effect of the $TiCl_4$ exposure is clearly seen by comparing traces 500 and 502 in FIG. 5.

Figure 6A:
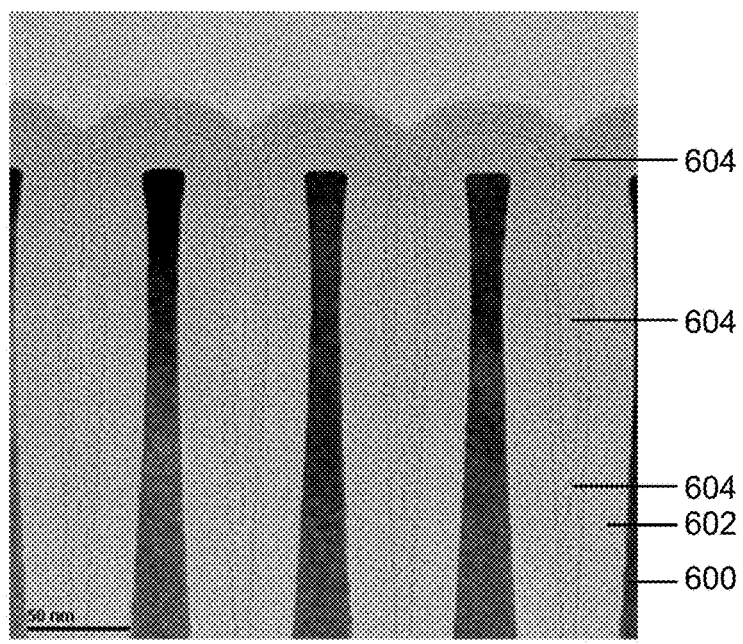
FIGS. 6A and 6B show Transmission Electron Microscope (TEM) images of void-free $SiO_2$ filling of recessed features with retrograde profiles according to an embodiment of the invention.
Figure 6B:
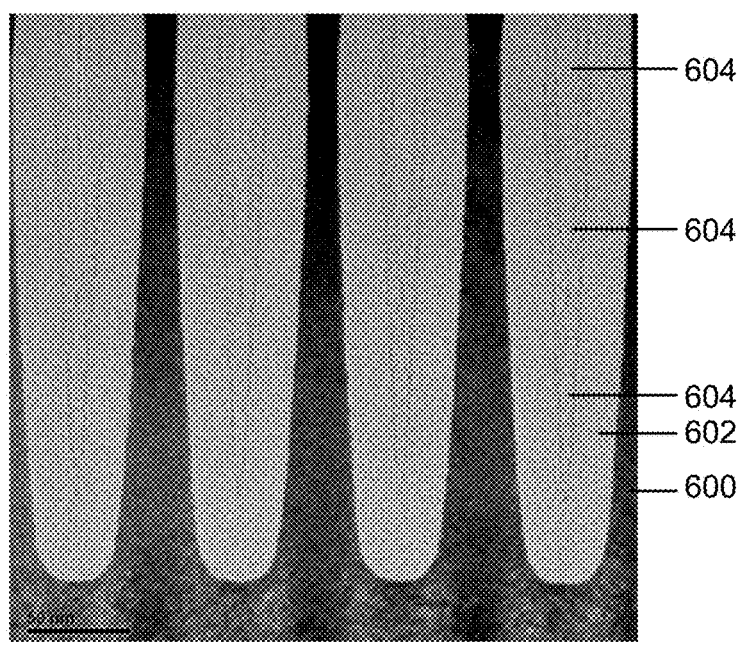

FIGS. 6A and 6B show Transmission Electron Microscope TEM images of void-free $SiO_2$ filling of recessed features having retrograde profiles according to an embodiment of the invention. FIG. 6A shows the upper portion of the filled recessed features and FIG. 6B shows lower portion of the filled recessed features. The recessed features were prepared by backfilling larger recessed features with $SiO_2$. The test structure contained a substrate 600, a backfilled $SiO_2$ layer 602 forming the recessed features with retrograde profiles, and void-free $SiO_2$ material 604 deposited using 16 deposition cycles that contained sequential exposures of $AlMe_3$, $TiCl_4$ (0.2 sec gas pulses), and silanol (TPSOL) at 150° C.

The void-free material filling of fine recessed features may be performed using well-known deposition systems. In one example, a single-wafer (substrate) apparatus includes a process chamber containing a substrate holder for supporting and heating the substrate, a pumping system for evacuating the process chamber, and a gas inlet manifold (showerhead) for sequentially introducing gases for processing the substrate. The gases can include a metal-containing catalyst (e.g., $AlMe_3$), a halogen-containing gas (e.g., $Cl_2$ or $TiCl_4$), and a silanol gas (e.g., TPSOL). In another example, a multi-wafer apparatus having a "Lazy-Susan" type configuration may be used where multiple substrates rotate around a common axis and are sequentially exposed to different gases. The gases can include a metal-containing catalyst (e.g., TMA), a halogen-containing gas (e.g., $Cl_2$ or $TiCl_4$), and a silanol gas (e.g., TPSOL). Purging regions may also be used to remove gases from the apparatus between sequential gas exposures.

Methods for void-free material filling of fine recessed features used in semiconductor manufacturing have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a patterned substrate containing a recessed feature having an opening, a sidewall and a bottom, the sidewall including an area of retrograde profile relative to a direction extending from a top of the recessed feature to the bottom of the recessed feature;
   coating the substrate with a metal-containing catalyst layer, wherein the coating includes exposing the substrate to $AlMe_3$ gas;
   deactivating a portion of the metal-containing catalyst layer that is near the opening of the recessed feature by exposure to a halogen-containing gas; and
   selectively depositing a material on the metal-containing catalyst layer in the recessed feature that has not been deactivated by the halogen-containing gas.

2. The method of claim 1, further comprising:
   repeating the coating, deactivating and selectively depositing at least once to deposit an additional amount of the material with no void in the recessed feature.

3. The method of claim 2, wherein the repeating is performed until the material fully fills the recessed feature.

4. The method of claim 1, wherein the material includes $SiO_2$.

5. The method of claim 4, wherein the $SiO_2$ is deposited in the absence of any oxidizing and hydrolyzing agent, and in the absence of a plasma, by exposing the substrate at a substrate temperature of approximately 150° C. or less, to a process gas containing a silanol gas.

6. The method of claim 5, wherein the process gas consists of a silanol gas and an inert gas.

7. The method of claim 5, wherein the silanol gas is selected from the group consisting of tris(tert-pentoxy) silanol, tris(tert-butoxy) silanol, and bis(tert-butoxy)(isopropoxy) silanol.

8. The method of claim 1, wherein the halogen-containing gas contains $Cl_2$, $BCl_3$, $CCl_4$, $TiCl_4$, HCl, HBr, or a combination thereof.

9. A substrate processing method, comprising:
   providing a patterned substrate containing a recessed feature having an opening, a sidewall and a bottom, the sidewall including an area of retrograde profile relative to a direction extending from a top of the recessed feature to the bottom of the recessed feature;
   coating the substrate with an aluminum-containing catalyst layer;
   deactivating a portion of the aluminum-containing catalyst layer that is near the opening of the recessed feature by exposure to a halogen-containing gas containing $Cl_2$; and
   selectively depositing an amount of a $SiO_2$ material on the aluminum-containing catalyst layer in the recessed feature that has not been deactivated by the halogen-containing gas.

10. The method of claim 9, further comprising:
    repeating the coating, deactivating and selectively depositing at least once to deposit an additional amount of the $SiO_2$ material with no void in the recessed feature.

11. The method of claim 10, wherein the repeating is performed until the $SiO_2$ material fully fills the recessed feature.

12. The method of claim 9, wherein the $SiO_2$ material is deposited in the absence of any oxidizing and hydrolyzing agent, and in the absence of a plasma, by exposing the substrate at a substrate temperature of approximately 150° C. or less, to a process gas containing a silanol gas.

13. The method of claim 12, wherein the process gas consists of a silanol gas and an inert gas.

14. The method of claim 12, wherein the silanol gas is selected from the group consisting of tris(tert-pentoxy) silanol, tris(tert-butoxy) silanol, and bis(tert-butoxy)(isopropoxy) silanol.

15. The method of claim 9, wherein the coating includes exposing the substrate to $AlMe_3$ gas.

16. A substrate processing method, comprising:
    providing a patterned substrate containing a recessed feature having an opening, a sidewall and a bottom, the sidewall including an area of retrograde profile relative to a direction extending from a top of the recessed feature to the bottom of the recessed feature;
    coating the substrate with an $AlMe_3$ catalyst layer;
    deactivating a portion of the $AlMe_3$ catalyst layer that is near the opening of the recessed feature by exposure to a halogen-containing gas;
    selectively depositing an amount of a $SiO_2$ material on the $AlMe_3$ catalyst layer in the recessed feature that has not been deactivated by the halogen-containing gas; and repeating the coating, deactivating and selectively depositing at least once to deposit an additional amount of the SiO$_2$ material until the SiO$_2$ material fully fills the recessed feature.

17. The method of claim 16, wherein the SiO$_2$ material is deposited in the absence of any oxidizing and hydrolyzing agent, and in the absence of a plasma, by exposing the substrate at a substrate temperature of approximately 150° C. or less, to a process gas containing a silanol gas, and wherein the silanol gas is selected from the group consisting of tris(tert-pentoxy) silanol, tris(tert-butoxy) silanol, and bis(tert-butoxy)(isopropoxy) silanol.

18. The method of claim 16, wherein the halogen-containing gas contains Cl$_2$, BCl$_3$, CCl$_4$, TiCl$_4$, HCl, HBr, or a combination thereof.

19. The method of claim 16, wherein the SiO$_2$ material is deposited in the absence of any oxidizing and hydrolyzing agent, and in the absence of a plasma, by exposing the substrate at a substrate temperature of approximately 150° C. or less, to a process gas containing a silanol gas.

20. The method of claim 16, wherein the halogen-containing gas contains Cl$_2$.

\* \* \* \* \*